Figure 1:
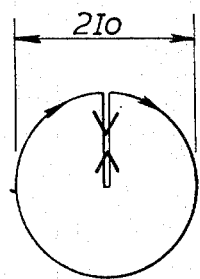

United States Patent [19]

Tench

[11] 4,001,792
[45] Jan. 4, 1977

[54] DRIVE FIELD FOR CIRCULAR MAGNETIC DOMAIN DEVICES
[75] Inventor: Michael Dennis Roy Tench, Blisworth, England
[73] Assignee: Plessey Handel und Investments AG., Zug, Switzerland
[22] Filed: Apr. 29, 1975
[21] Appl. No.: 572,874
[30] Foreign Application Priority Data
  May 17, 1974  United Kingdom ............ 22014/74
[52] U.S. Cl. ................... 340/174 TF; 340/174 CB
[51] Int. Cl.² ...................................... G11C 11/14
[58] Field of Search ............................. 340/174 TF
[56] References Cited
  UNITED STATES PATENTS
  3,744,042   7/1973   Cutler et al. ................. 340/174 TF OTHER PUBLICATIONS
IEEE Transactions on Magnetics—Vol. Mag-9, No. 3, Sept. 1973, pp. 436–440.

Primary Examiner—James W. Moffitt
Attorney, Agent, or Firm—Fleit & Jacobson

[57] ABSTRACT

A circular magnetic demain device which includes bias magnets for applying a steady bias magnetic field in a direction normal to a major surface of the device's uniaxial magnetic layer; rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; and means for providing a holding magnetic field in the direction of the magnetic field provided by the said one pair of coils. In a preferred arrangement the holding magnetic field is provided by tilting the magnetic field of the bias magnets off-normal.

8 Claims, 10 Drawing Figures

DRIVE FIELD FOR CIRCULAR MAGNETIC DOMAIN DEVICES

The invention relates to circular magnetic domain devices.

Known circular magnetic domain devices include a thin layer of uniaxial magnetic material, for example, orthoferrite, which possesses an easy axis for a magnetic vector that is directed normal to the thin magnetic layer. It is possible for the thin magnetic layer to possess a positive magnetic vector at all points except for a few small circular regions, called magnetic domains or magnetic bubbles, within which the magnetic vector is negative. It should be noted that the polarities positive and negative are only arbitrarily assigned. The cylindrical internal surface forming the boundary between each of the magnetic domains and the remainder of the magnetic material of the thin layer are termed domain walls or, more explicitly, 180° Bloch walls. The magnetic domains or bubbles are nucleated and made to propagate within the thin magentic layer in a manner which is described by A. H. Bobeck et al in the I.E.E.E. Transactions on Magnetics, Volume MAG.5, No. 3 September, 1969 at pages 544 to 565.

Propagation of the magnetic domains is caused by successively inducing attractive poles in a thin film pattern of a soft magnetic material such as isotropic permalloy formed on the surface of the thin magnetic layer. This is accomplished by means of a rotating magnetic field in the plane of the soft magnetic pattern which operates in addition to a steady bias magnetic field applied normally to the thin magnetic layer. The rotating magnetic field is generated by two pairs of coils arranged with their axes at right angles to each other but in the plane of the soft magnetic pattern and the thin magnetic layer. The coil pairs are driven with sinusoidal current waveforms with a 90° time phase difference between the currents in each pair of coils. In practice, the magnetic drive field strength of both pairs of coils are matched so that a uniform rotating field is obtained to effect movement of the magnetic domains.

When using a rotating magnetic field which performs one or more cycles then stops, there is a length of time when one of the two magnetic drive fields is on and the other is off. The resultant Lissajou of the magnetic drive field is illustrated in FIG. 1 of the drawings.

It has been found that the direction of the initial start/stop magnetic field with respect to the elements of the soft magnetic pattern is important. The most sensitive elements such as the magnetic domain generators, 90° and 180° corners, cannot always be arranged with one another to ensure that one drive start field direction is the optimum. To avoid any dependence on the initial start direction, it is necessary to initiate the drive field from the circumference of the Lissajou.

The invention provides a circular magnetic domain device which includes bias magnets for applying a steady bias magnetic field in a direction normal to a major surface of the device's uniaxial magnetic layer; rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; and means for providing a holding magnetic field in the direction of the magnetic field provided by the said one pair of coils. In a preferred arrangement the holding magnetic field is provided by tilting the magnetic field of the bias magnets off-normal.

Figure 2:
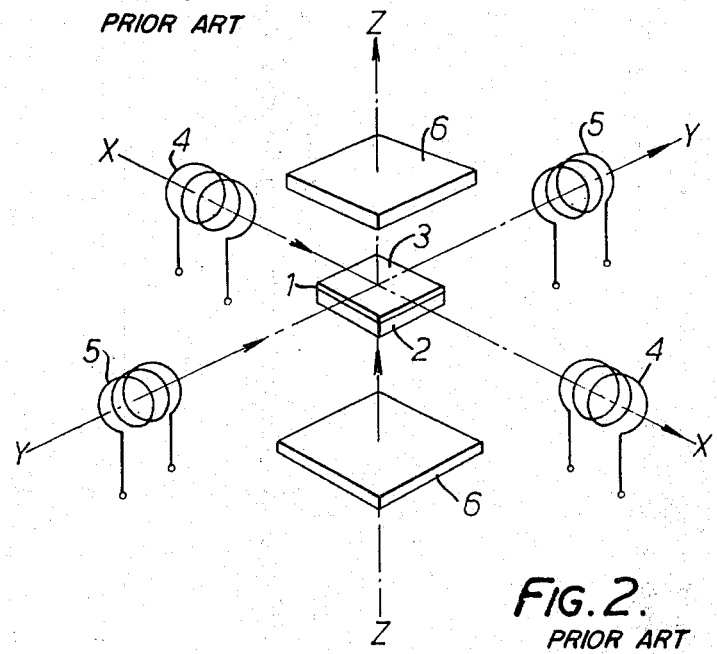

The foregoing and other features according to the invention will be better understood from the following description with reference to FIGS. 1–6 of the drawings accompanying the provisional specification and FIGS. 7 – 10 of the accompanying drawings in which:

FIG. 1 illustrates the Lissajou of the rotating magnetic drive field of known circular magnetic domain devices, FIG. 2 diagrammatically illustrates in a pictorial view an arrangement of a known circular magnetic domain device.

Figure 4:
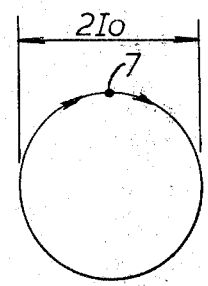
Figure 3:
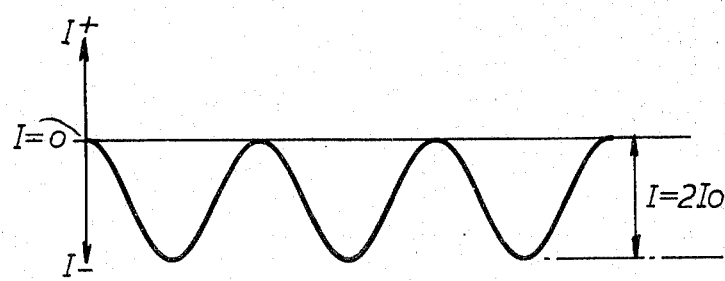
Figure 7:
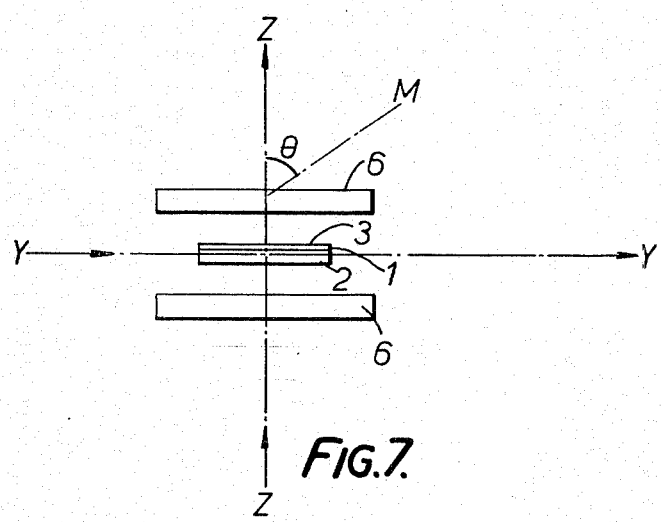
Figure 8:
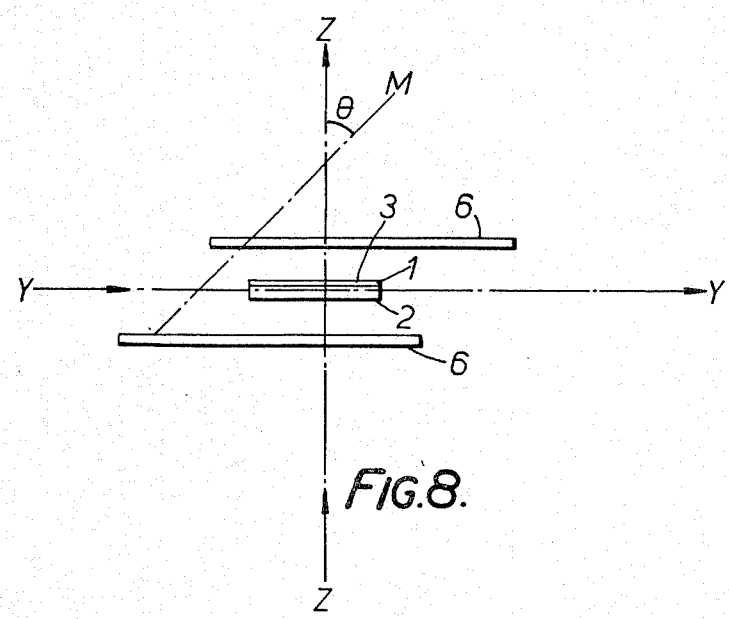
Figure 9:
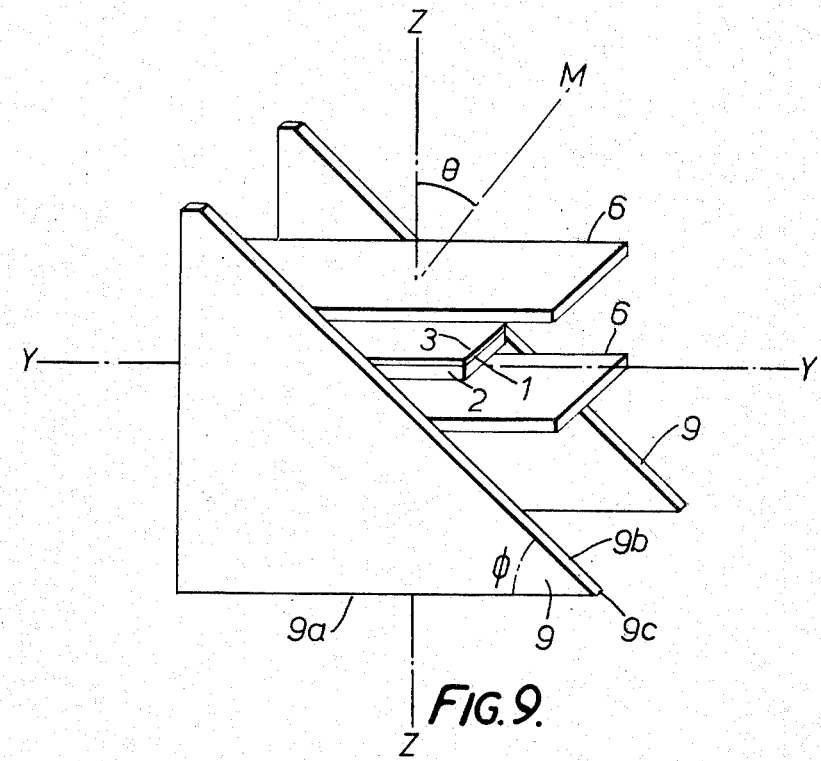
Figure 10:
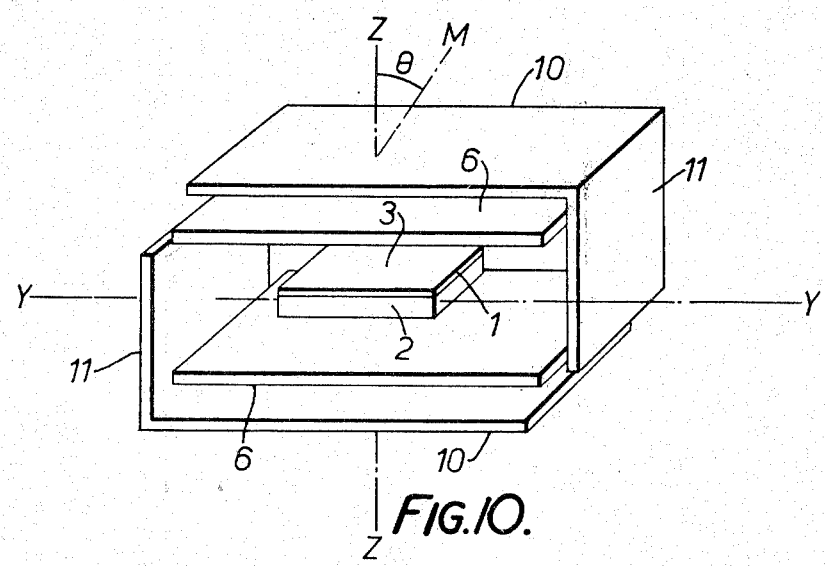

FIG. 3 illustrates a waveform used in the generation of a rotating magnetic field having the Lissajou of FIG. 4, FIG. 4 illustrates the Lissajou of the rotating magnetic drive field of the circular magnetic domain device according to the invention, FIGS. 5, 6, 7 and 8 diagrammatically illustrate in side elevations alternative arrangements for the circular magnetic domain device according to the invention, and, FIGS. 9 and 10 pictorially illustrate arrangements for the circular magnetic domain device according to the invention.

A known circular magnetic domain device is illustrated in FIG. 2 of the drawings in a pictorial view and includes a uniaxial magnetic layer 1, for example of garnet, formed on a substrate 2. The layer 1 possesses an easy axis i.e. the axis Z.Z, for a magnetic vector directed normal to the layer. Circular magnetic domains can, as is described in detail in the previously cited I.E.E.E. Transactions, be nucleated and caused to propagate within the layer 1 by the use of a permeable circuit (not illustrated) which would be formed on a surface 3 of the layer 1 and which would be constituted by a pattern of soft magnetic material, for example, isotropic permalloy.

A pair of coils 4 and a pair of coils 5, for generating a rotating magnetic field in the layer 1 by means of which circular magnetic domain propagation is effected, are arranged with their axes X—X and Y—Y at right angles to each other and in the plane of the layer. The coil pairs in this example are, as previously stated, driven in a known manner with sinusoidal current waveforms with a 90° time phase difference between the currents in each pair of coils in order to generate the rotating magnetic field in the layer 3. The Lissajou which results when a rotating drive field produced in this manner performs one or more cycles then stops, is illustrated in FIG. 1. Cylindrical magnetic domains are at rest with this arrangement when there is no in-plane magnetic field applied to the layer 3.

A steady bias magnetic field is applied to the layer 1 in known manner by bias magnets 6, the magnetic field produced by the magnets 6 being directed along the axis Z—Z.

As stated in a preceding paragraph it is necessary, as is illustrated in FIG. 4 of the drawings, to initiate the magnetic drive field from a static position 7 on the circumference of the Lissajou in order to avoid any dependence on the initial start direction by having an in-plane magnetic field present even when the cylindrical domains are at rest.

If one of the magnetic drives fields i.e. the magnetic field associated with the coils 5, is produced by the unipolar sinusoidal current waveform of FIG. 3 which stops and starts at zero then the required Lissajou of FIG. 4 will be produced with the addition of a holding magnetic field directed along the axis Y—Y.

Figure 5:
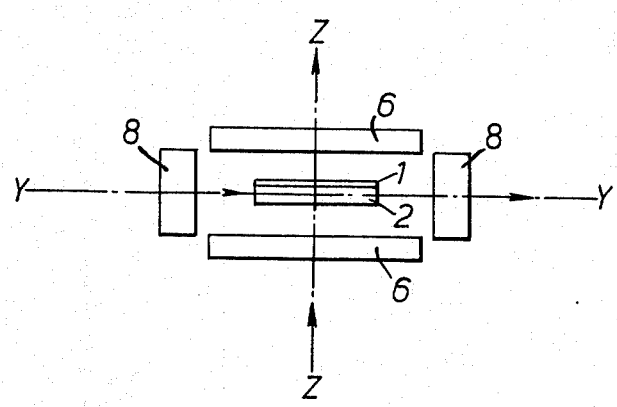

FIG. 5 diagrammatically illustrates a method of producing a holding magnet field directed along the Y—Y axis. This is achieved by having, in addition to the original bias magnets 6 in the Z—Z direction, a second pair of magnets 8 in the Y—Y direction. The use of the current waveform of FIG. 3 which can be generated by one or more coils, and the magnets 8 avoid the necessity for a DC current applied to the coils 5 even when the cylindrical domains are at rest.

Figure 6:
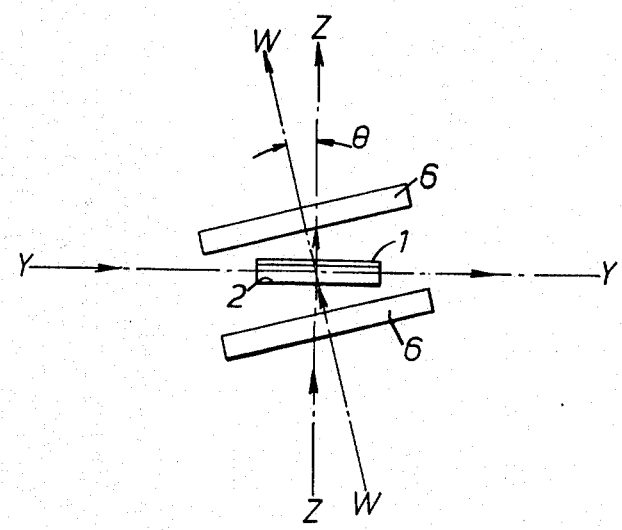

In the arrangement of FIG. 6, the holding magnetic field is obtained by tilting the bias magnets 6 off-normal i.e. so that the associated magnetic field is directed along an axis W—W which is at an angle $\Theta$ to the normal magnetic bias field axis Z—Z. Hence, the associated magnet field along the W—W axis is at an angle $\Theta$ to the Z—Z axis. The strength of the magnetic field along the W—W axis is of a known magnitude, and the angle $\Theta$ will also be known, therefore, the strength of the magnetic field along the Y—Y and Z—Z axes can be vectorially calculated.

A similar situation can be achieved by the arrangements of FIGS. 7 and 8. In FIG. 7 the holding magnetic field is produced by magnetising the bias magnets 6 at an angle $\Theta$ relative to the Z—Z axis, i.e. so that the magnetic field is directed along the axis W—W which is indicated by the dotted line M in FIG. 7.

In FIG. 8, the bias magnets 6 are magnetised in the Z—Z direction and are offset in opposite directions relative to the Z—Z axis. This results in the magnetic field between the offset bias magnets 6 to be directed along the W—W axis which is indicated in FIG. 8 by the dotted line M. The resulting magnetic field is, therefore, produced at an angle $\Theta$ to the Z—Z axis. The strength of the magnetic field between the offset bias magnets 6 is of a known value and the angle $\Theta$ will also be known, therefore, the strength of the magnetic fields along the Y—Y and Z—Z axes can be readily calculated.

Alternatively, the holding magnetic field can, as is diagrammatically illustrated in FIGS. 9 and 10 of the drawings, be produced with the aid of one or more additional members which must be constructed from an alloy with a high magnetic permability at low field strength, and a low hysteresis loss. A typical alloy which could be used is permalloy.

In FIG. 9, the two members are indicated by the reference numeral 9, are wedge shaped and are positioned one on each side of the bias magnets 6 in a parallel relationship with the Y—Y axis. The members 9 create a degree of asymmetry in the magnetic field produced between the bias magnets 6 in that the members 9 each act as a magnetic shunt, and therefore acquire induced magnetism. The asymmetry produced as a result of the shunting action of the members 9 causes the magnetic field associated with the bias magnets 6 to be directed along the W—W axis, which is denoted by the dotted line M in FIG. 9. The angle $\Theta$ between the line M and the Z—Z axis is a function of the angle $\Phi$ i.e. the angle between the base 9a, and the sloping edge 9b, of the member 9. In the arrangement shown the base 9a is positioned parallel to the Y—Y axis and an end face 9c of member 9 is positioned normal to the Y—Y axis. Thus if the strength of the magnetic field in the direction of the line M is known, and the angle $\Theta$ between the line M, and the Z—Z axis is also known, then the strength of the holding magnetic field in the Y—Y direction can be readily calculated.

Similarly in FIG. 10, two plates are used to create a degree of asymmetry in the magnetic field produced by the bias magnets 6, by the same method as the members 9, in FIG. 9. Each member is L-shaped, and positioned so that a limb denoted by the reference numeral 10 is parallel to the Y—Y axis, and a limb denoted by the reference numeral 11 is parallel to the Z—Z axis. The two members together form a rectangular enclosure which surrounds the bias magnets 6. The direction of the magnetic field which is denoted by the dotted line M can be altered by varying the amount by which the limb 11 extends across the gap between the bias magnets 6. The angle between the line M and the Z—Z axis is denoted by $\Theta$. Thus if the strength of the magnetic field in the direction of the line M is known, and the angle $\Theta$ between the line M, and the Z—Z axis is also known, then the strength of the holding magnetic field in the Y—Y direction can be readily calculated.

In FIGS. 5 to 10, the coils 4 and 5 are omitted from the drawings for the sake of clarity.

In practice, the holding magnetic field directed along the Y—Y axis would need to be 30 Oersteds (oe) and the normal bias magnetic field directed along the Z—Z axis would need to be 80 Oe. These magnetic conditions can be achieved with the arrangements shown in FIGS. 6 to 10, by making $\Theta$ equal to 20°, and by having the bias magnets 6 provide a magnetic field of 86 Oe in the W—W direction i.e. in the direction of the line M in FIGS. 7 to 10.

In addition to the sinusoidal current waveform employed in the foregoing examples, square or trapesoidal current waveforms can be used to generate the rotating magnetic field. It will of course be apparent that the Lissajou's of FIGS. 1 and 4 will no longer be circular with current waveforms of this type. The Lissajou will be diamond shaped for the square current waveform, and octagonal for the trapesoidal current waveform.

It is to be understood that the foregoing description of specific examples of this invention is made by way of example only and is not to be considered as a limitation in its scope.

What is claimed is:

1. A circular magnetic domain device which includes a first pair of bias magnets for applying a steady bias magnetic field in a direction normal to a major surface of the device's uniaxial magnetic layer; rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; and a second pair of bias magnets for applying a steady holding magnetic field in the direction of the magnetic field provided by the said one pair of coils, the steady bias magnetic field being applied to the uniaxial magnetic layer in the plane of the said major surface thereof.

2. A circular magnetic domain device which includes a pair of bias magnets for applying a steady bias magnetic field in a direction normal to a major surface of the device's uniaxial magnetic layer; and rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; wherein the said pair of bias magnets are tilted in a manner whereby the magnetic field therebetween is produced at an angle relative to an axis normal to the said uniaxial magnetic layer to provide a holding magnetic field in the direction of the magnetic field provided by the said one pair of coils.

3. A circular magnetic domain device which includes a pair of bias magnets for applying a steady bias magnetic field in a direction normal to a major surface of the device's uniaxial magnetic layer; and rotating magnetic field generating means for causing circular magnetic domains generated in the said layer to propagate with the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; wherein the said pair of bias magnets are magnetised at an angle relative to an axis normal to the said major surface of the uniaxial magnetic layer to provide a holding magnetic field in the direction of the magnetic field provided by the said one pair of coils.

4. A circular magnetic domain device which includes a pair of bias magnets for applying a steady bias magnetic field in a direction normal to a major surface of the device's uniaxial magnetic layer; and rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; wherein the said pair of bias magnets are offset in opposite directions parallel to the said major surface of the uniaxial layer such that the field produced therebetween is at an angle relative to an axis normal to the said major surface of the uniaxial magnetic layer to provide a holding magnetic field in the direction of the magnetic field provided by the said one pair of coils.

5. A circular magnetic domain device which includes a pair of bias magnets for applying a steady bias magnetic field in a direction normal to a major surface of the device's uniaxial magnetic layer; rotating magnetic field generating means for causing circular magnetic domains generated in the said layer to propagate within the layer along at least one path defined by a permeable circuit pattern formed on the said major surface, the generating means including two pairs of coils having their axes at right angles to each other and in the plane of the said major surface, one pair of coils being operable to provide an oscillating field which is unipolar and stops and starts at zero; and means for generating a holding magnetic field in the direction of the magnetic field provided by the said one pair of coils, the holding magnetic field generating means including at least one member, which is of an alloy having a high permeability at low field strength, and low hysteresis loss, and which acts as a magnetic shunt, the position of the said at least one member relative to the said pair of bias magnets, and the shape of the said member being such that the magnetic field produced between the said pair of bias magnets is in a direction which is at an angle to an axis normal to the said major surface of the uniaxial magnetic layer.

6. A circular magnetic domain device as claimed in claim 5, including two of the said members which each act as a magnetic shunt and thereby facilitate the provision of the said magnetic field at an angle to the said normal axis.

7. A circular magnetic domain device as claimed in claim 6, wherein each of the said members is substantially flat and wedge shaped, wherein the said members are positioned one each side of the bias magnets so that the major surfaces of the said members are parallel to the magnetic field produced by the said one pair of coils, and normal to the said major surface of the uniaxial magnetic layer, wherein one of the wedge defining edges of each of the said members is at an angle relative to the said major surface of the uniaxial magnetic layer, and wherein the said angle of the magnetic field direction is proportional to the said angle of the wedge defining edges of the members.

8. A circular magnetic domain device as claimed in claim 6, wherein the said members are L-shaped and are each positioned relative to a separate one of the said bias magnets in a manner whereby one limb of the L is parallel to the said major surface of the uniaxial magnetic layer whilst the other limb of the L is parallel to the said normal axis and extends across the gap between the said bias magnets, the amount by which the said other limb extends across the said gap being proportional to the angle of the magnetic field direction.

* * * * *